United States Patent
Lee et al.

(10) Patent No.: US 9,312,024 B2
(45) Date of Patent: Apr. 12, 2016

(54) FLASH MEMORY DEVICE HAVING EFFICIENT REFRESH OPERATION

(71) Applicant: FIDELIX CO., LTD., Seongnam-si, Gyeonggi-do (KR)

(72) Inventors: Seung Keun Lee, Yongin-si (KR); Jong Bae Jeong, Gwangju-si (KR); Hi Hyun Han, Icheon-si (KR)

(73) Assignee: FIDELIX CO., LTD., Seongnam-Si, Gyeonggi-Do (KR)

( * ) Notice: Subject to any disclaimer, the term of this patent is extended or adjusted under 35 U.S.C. 154(b) by 28 days.

(21) Appl. No.: 14/534,465

(22) Filed: Nov. 6, 2014

(65) Prior Publication Data

US 2015/0131385 A1    May 14, 2015

(30) Foreign Application Priority Data

Nov. 8, 2013 (KR) .................... 10-2013-0135099

(51) Int. Cl.
- G11C 7/00 (2006.01)
- G11C 16/34 (2006.01)
- G11C 16/26 (2006.01)
- G11C 13/00 (2006.01)

(52) U.S. Cl.
CPC ............ *G11C 16/3418* (2013.01); *G11C 16/26* (2013.01); *G11C 13/0033* (2013.01)

(58) Field of Classification Search
CPC ........... G11C 13/0033; G11C 16/3418; G11C 11/401; G11C 11/402
USPC .................. 365/222, 230.01, 230.03, 230.06
See application file for complete search history.

(56) References Cited

U.S. PATENT DOCUMENTS

| 5,321,661 A * | 6/1994 | Iwakiri | G11C 29/02 365/201 |
|---|---|---|---|
| 2009/0040849 A1* | 2/2009 | Mori | G11C 7/1045 365/201 |
| 2010/0142301 A1* | 6/2010 | Tashiro | G11C 11/406 365/201 |

FOREIGN PATENT DOCUMENTS

JP    9-50698    2/1997

* cited by examiner

*Primary Examiner* — Han Yang
(74) *Attorney, Agent, or Firm* — Kile Park Reed & Houtteman PLLC

(57) ABSTRACT

Provided is a flash memory device capable of efficiently performing a refresh operation. The flash memory device includes a normal memory array including a plurality of normal memory cells arranged in a matrix of word lines and bit lines, wherein the plurality of normal memory cells are divided into a plurality of memory blocks and are programmable and erasable; a refresh address generation unit configured to generate a refresh block address, wherein the refresh block address is sequentially increased in response to activation of a refresh driving signal; and a refresh driving unit driven to refresh a memory block specified by the refresh block address among the memory blocks of the normal memory array in a unit refresh frame, and generate the refresh driving signal. In the flash memory device, a refresh operation may be efficiently performed to fix a data disturbance.

13 Claims, 4 Drawing Sheets

FLASH MEMORY DEVICE HAVING EFFICIENT REFRESH OPERATION

CROSS-REFERENCE TO RELATED APPLICATION

This application claims priority to and the benefit of Korean Patent Application No. 2013-0135099, filed on Nov. 8, 2013, the disclosure of which is incorporated herein by reference in its entirety.

BACKGROUND

1. Field of the Invention

The present invention relates to flash memory, and more particularly, to flash memory capable of fixing a disturbance occurring in data stored therein.

2. Discussion of Related Art

A flash memory device includes a plurality of non-volatile memory cells which are arranged in a matrix of word lines and bit lines and that are capable of retaining data stored therein even when power is not provided.

In a flash memory device, a program operation of programming data in the memory cells and an erase operation of erasing the data programmed in the memory cells are repeatedly performed.

In this case, a data disturbance that lowers a threshold voltage of a non-selected memory cell may occur during the erase operation.

SUMMARY OF THE INVENTION

The present invention is directed to a flash memory device capable of efficiently performing a refresh operation to fix a data disturbance.

According to an aspect of the present invention, there is provided a flash memory device including a normal memory array including a plurality of normal memory cells arranged in a matrix of word lines and bit lines, wherein the plurality of normal memory cells are divided into a plurality of memory blocks and are programmable and erasable; a refresh address generation unit configured to generate a refresh block address, wherein the refresh block address is sequentially increased in response to activation of a refresh driving signal and is retained even when power is not supplied; and a refresh driving unit driven to refresh a memory block specified by the refresh block address among the memory blocks of the normal memory array in a unit refresh frame, and generate the refresh driving signal.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
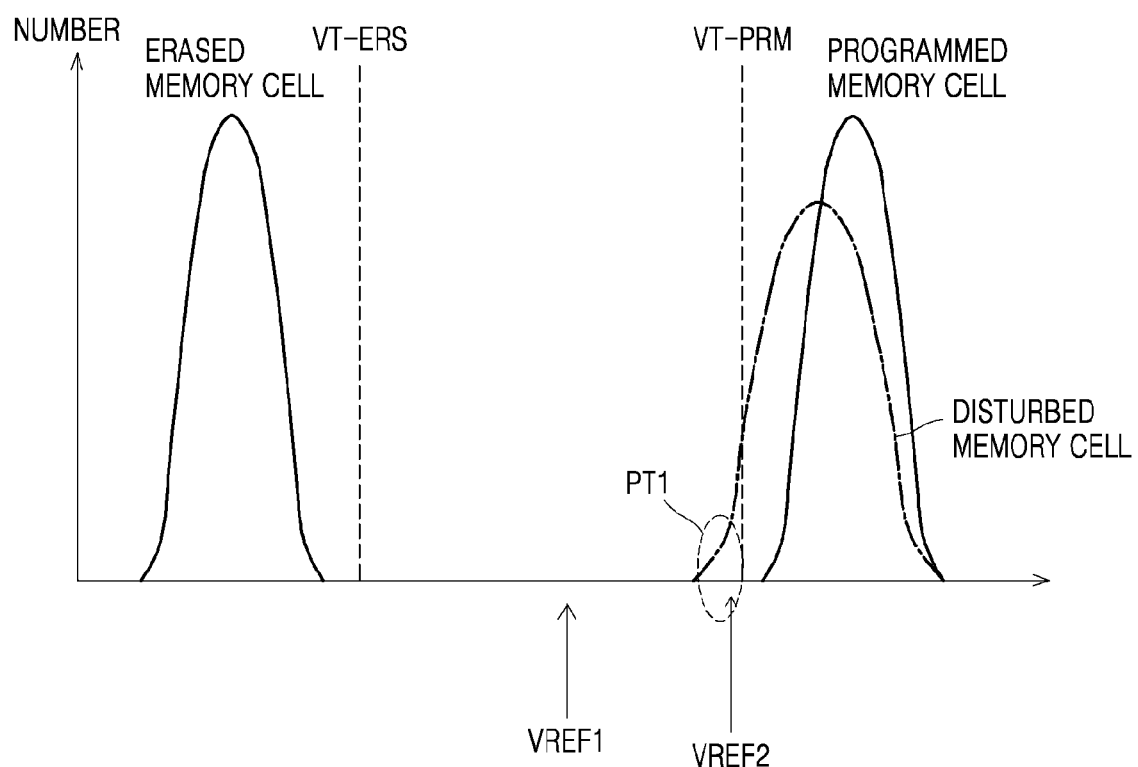
FIG. 1 is a graph illustrating a data disturbance occurring in a flash memory device.

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "upper" may be used herein to describe one element's relationship to another elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of the present invention will be described in detail with reference to the accompanying drawings.

First, a 'data disturbance' will be described with reference to FIG. 1 before a flash memory device according to an embodiment of the present invention is described.

In general, a program operation is performed in a flash memory device based on a channel hot electron (CHE) method. In this case, a bit line of a selected memory cell is driven with about 3.75 V (volt) and a gate of a memory cell connected to a selected word line is driven with about 9 V.

Thus, a programmed memory cell has a threshold voltage that is higher than a program reference voltage VT-PRM.

In general, an erase operation is performed according to the Fowler-Nordheim (FN) method. A high voltage, e.g., about 9 V, is applied to a bulk of a selected flash memory cell and a low voltage, e.g., about −9 V, is applied to a gate of the selected flash memory cell.

Thus, an erased memory cell has a threshold voltage that is lower than an erase reference voltage VT-ERS.

However, in the erase operation, a high voltage may be also applied to a bulk of a non-selected memory cell. Thus, a bulk disturbance that disturbs a threshold voltage of a programmed memory cell may occur.

As a result, a 'data disturbance' causing a threshold voltage to be lower than the program reference voltage VT-PRM may occur in a portion of the programmed memory cell (see a region 'PT1' of FIG. 1).

In this case, a refresh operation is performed on the programmed memory cell in which the 'data disturbance' occurs and causes the threshold voltage thereof to be higher than the program reference voltage VT-PRM.

Figure 2:
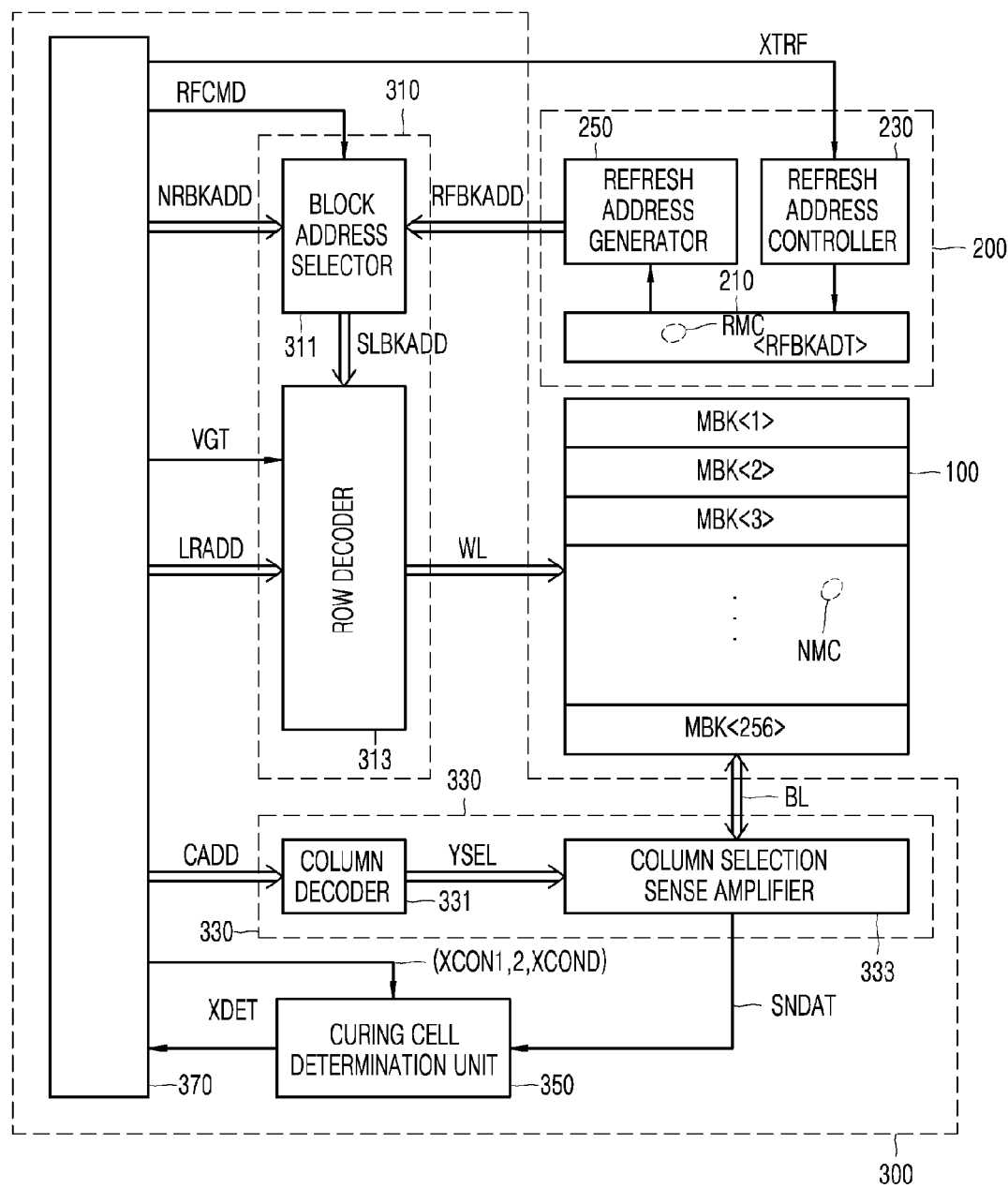
FIG. 2 is a block diagram of a flash memory device according to an embodiment of the present invention.

FIG. 2 is a block diagram of a flash memory device according to an embodiment of the present invention. Referring to FIG. 2, the flash memory device according to an embodiment of the present invention includes a normal memory array 100, a refresh address generation unit 200, and a refresh driving unit 300.

The normal memory array 100 includes a plurality of normal memory cells NMC arranged in a matrix of word lines WL and bit lines BL. The word lines WL are connected to a gate of a selected normal memory cell NMC.

The plurality of normal memory cells NMC may be divided into several memory blocks MBK, and are programmable and erasable.

The refresh address generation unit 200 generates a refresh block address RFBKADD. The refresh block address RFBKADD is sequentially increased in response to activation of an refresh driving signal XTRF. The refresh block address RFBKADD may be retained even when power is not supplied as well as when power is supplied.

It is assumed that the refresh operation is performed in units of frames in the flash memory device according to an embodiment of the present invention. In this case, for example, the refresh operation is performed on one memory block in the case of a unit refresh frame.

The refresh operation may be performed on the unit refresh frame while a normal operation such as a read operation, a program operation, or an erase operation is not performed in the flash memory device according to an embodiment of the present invention. Also, the flash memory device according to an embodiment of the present invention may be designed such that the refresh operation is performed on the unit refresh frame at the same time that the flash memory device is powered on.

Referring to FIG. 2, the refresh driving unit 300 is driven to refresh a memory block MBK specified by the refresh block address RFBKADD among the memory blocks MBK of the normal memory array 100 in the unit refresh frame.

Also, the refresh driving unit 300 generates the refresh driving signal XTRF. The refresh driving signal XTRF is activated once in the unit refresh frame, and deactivated when the memory block MBK specified by the refresh block address RFBKADD is determined as 'refresh failure.'

Thus, in the flash memory device according to an embodiment of the present invention, the refresh block address RFBKADD is sequentially increased as the refresh operation is repeatedly performed on the unit refresh frame. However, the refresh block address RFBKADD is maintained when the memory block MBK of the unit refresh frame specified by the refresh block address RFBKADD is determined as 'refresh failure,' regardless of whether the refresh operation is repeatedly performed on the unit refresh frame.

In the present disclosure, the term "refresh failure" represents a case in which the number of programmed normal memory cell(s) NMC (which store(s) data in which a disturbance occurs) of a memory block MBK on which the refresh operation is performed is one or is equal to or greater than a predetermined number.

In contrast, term "refresh success" represents a case in which the number of programmed normal memory cell(s) NMC (which store(s) data in which a disturbance occurs) of a memory block MB K on which the refresh operation is performed is zero or is less than a predetermined number.

The refresh address generation unit 200 will now be described in detail. In this embodiment, the refresh address generation unit 200 includes a refresh address storing memory 210, a refresh address controller 230, and a refresh address generator 250.

The refresh address storing memory 210 includes a plurality of refresh memory cells RMC for storing refresh block data RFBKDAT. The plurality of refresh memory cells RMC are capable of retaining the refresh block data RFBKDAT stored therein even when power is not supplied as well as when power is supplied.

The plurality of normal memory cells NMC of the normal memory array 100 and the plurality of refresh memory cells RMC of the refresh address storing memory 210 may be, for example, non-volatile memory cells.

The refresh address controller 230 is driven to increase the refresh block data RFBKDAT in response to activation of the refresh driving signal XTRF.

The refresh address generator 250 is driven to generate the refresh block address RFBKADD corresponding to the refresh block data RFBKDAT stored in the refresh address storing memory 210.

Next, the refresh address driving unit 300 will be described in detail.

In this embodiment, the refresh address driving unit 300 includes a row selection unit 310, a column selection sensing unit 330, a curing cell determination unit 350, and a controller 370. The row selection unit 310 is driven to activate word lines WL of the memory block MBK specified by the refresh block address RFBKADD of the unit refresh frame.

More specifically, the row selection unit 310 includes a block address selector 311 and a row decoder 313.

The block address selector 311 generates a selected block address SLBKADD which is either the refresh block address RFBKADD or a normal block address NRBKADD selected according to whether a refresh command RFCMD occurs.

In this case, the normal block address NRBKADD specifies the memory block MBK of the normal memory array 100 in a normal operation mode. In the present embodiment, the refresh command RFCMD and the normal block address NRBKADD are provided from the controller 370.

In other words, when the refresh command RFCMD occurs, the refresh block address RFBKADD is generated as the selected block address SLBKADD. In the normal operation mode that is not related to the refresh command RFCMD, the normal block address NRBKADD is generated as the selected block address SLBKADD.

The row decoder 313 is driven to specify the word lines WL of the normal memory array 100 by decoding the selected block address SLBKADD and a lower row address LRADD.

In this case, the row decoder 313 controls the word lines WL using a gate control voltage VGT provided from the controller 370. For example, the gate control voltage VGT may be a voltage, such as 3.75 V or −9 V, appropriate for an operation mode of the flash memory device according to the present invention.

The column selection sensing unit 330 is driven to specify a bit line BL to correspond to a column address CADD provided from the controller 370, sense data of the specified bit line BL, and output the sensed data as sensing data SNDAT.

In this embodiment, the column selection sensing unit 330 includes a column decoder 331 and a column selection sense amplifier 333.

The column decoder 331 is driven to activate a specific column selection signal YSEL by decoding the column address CADD.

The column selection sense amplifier 333 senses data of a bit line BL selected by the activated column selection signal YSEL and provides the sensed data as the sensing data SNDAT.

The curing cell determination unit 350 generates a disturbance determination signal XDET. In this case, the disturbance determination signal XDET is activated when it is determined that a disturbance occurs based on the sensing data SNDAT output from the column selection sensing unit 330.

That is, the disturbance determination signal XDET is activated when the specified memory block MBK is determined as 'refresh failure.'

Figure 3:
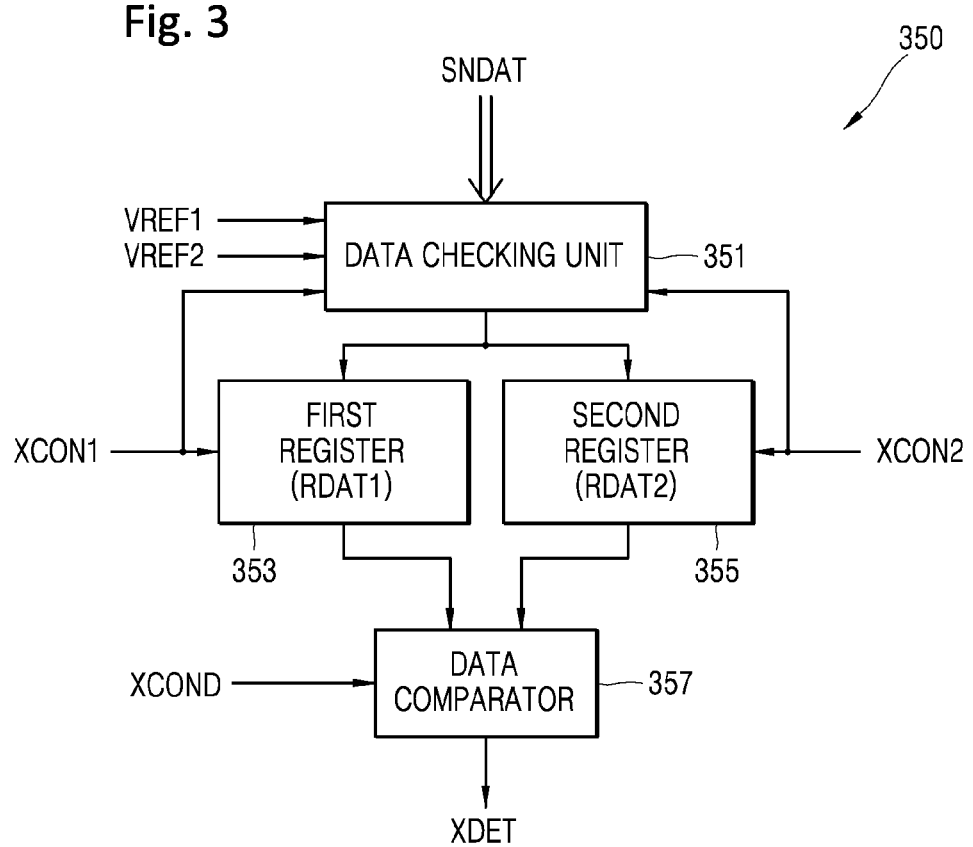
FIG. 3 is a detailed block diagram of a curing cell determination unit of FIG. 1.

FIG. 3 is a detailed block diagram of the curing cell determination unit 350 of FIG. 2. Referring to FIG. 3, the curing cell determination unit 350 includes a data checking unit 351, a first register 353, a second register 355, and a data comparator 357.

The data checking unit 351 checks a data value of the sensing data SNDAT during first refresh driving in which a first checking driving signal XCON1 is activated, based on a first reference voltage VREF1 (also see FIG. 1).

Also, the data checking unit 351 checks a data value of the sensing data SNDAT during second refresh driving in which a second checking driving signal XCON2 is activated, based on a second reference voltage VREF2 (also see FIG. 1).

In this case, the first reference voltage VREF1 is higher than the erase reference voltage VT-ERS (see FIG. 1) and is lower than the program reference voltage VT-PRM (see FIG. 1). The second reference voltage VREF2 is higher than the first reference voltage VREF1, and may be substantially the same as the program reference voltage VT-PRM.

The first register 353 stores a data value of the sensing data SNDAT checked based on the first reference voltage VREF1 during the first refresh driving as first checking read data RDAT1.

The second register 355 stores a data value of the sensing data SNDAT checked based on the second reference voltage VREF2 during the second refresh driving as second checking read data RDAT2.

The data comparator 357 generates the disturbance determination signal XDET by comparing the first checking read data RDAT1 and the second checking read data RDAT2 with each other during checking refresh driving in which a comparison driving signal XCOND is activated.

In this case, the disturbance determination signal XDET is activated when a memory block MBK specified in the unit refresh frame is determined as 'refresh failure.'

That is, the disturbance determination signal XDET is activated when the first checking read data RDAT1 and the second checking read data RADT2 of a normal memory cell NMC of the specified memory block MBK of the unit refresh frame are different.

In the present embodiment, all of the 'first refresh driving,' the 'second refresh driving,' and the 'checking refresh driving' are related to the unit refresh frame, and the first checking driving signal XCON1, the second checking driving signal XCON2, and the comparison driving signal XCOND are provided from the controller 370.

Referring back to FIG. 2, the controller 370 generates the refresh driving signal XTRF. In this case, the refresh driving signal XTRF is activated when a refresh operation is performed. However, the refresh driving signal XTRF is deactivated when the disturbance determination signal XDET is activated.

Next, a method of controlling a refresh block address RFBKADD during a refresh operation of a flash memory device according to an embodiment of the present invention will be described.

Figure 4:
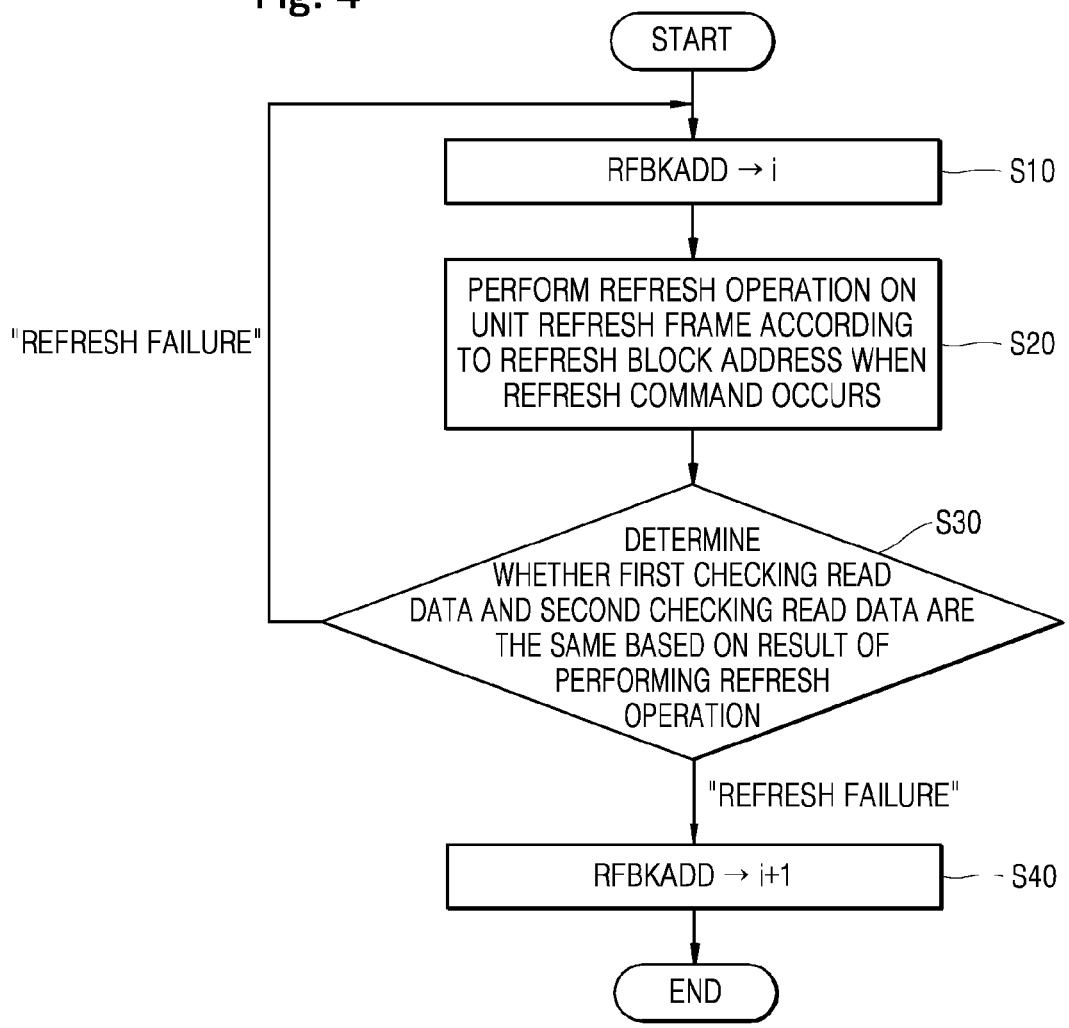
FIG. 4 is a flowchart of a method of controlling a refresh block address during a refresh operation of a flash memory device according to an embodiment of the present invention.

FIG. 4 is a flowchart of a method of controlling a refresh block address RFBKADD during a refresh operation of a flash memory device according to an embodiment of the present invention.

First, it is assumed in this exemplary embodiment that the refresh block address RFBKADD is 'i' (operation S10).

When a refresh command RFCMD occurs, a refresh operation is performed on a unit refresh frame according to the refresh block address RFBKADD (operation S20).

Then, it is determined whether first checking read data RDAT1 and second checking read data RDAT2 of each of normal memory cells NMC of a target memory block MBK are the same based on a result of performing the refresh operation (operation S30).

When it is determined in operation S30 that the first checking read data RDAT1 and the second checking read data RDAT2 of all the normal memory cells NMC are the same and thus the disturbance determination signal XDET is deactivated, i.e., when it is determined that 'refresh success' occurs, the refresh block address RFBKADD is increased to 'i+1' (operation S40).

When it is determined in operation S30 that the first checking read data RDAT1 and the second checking read data RDAT2 of at least one among the normal memory cells NMC are different and thus the disturbance determination signal XDET is activated, i.e., when it is determined that 'refresh failure' occurs, the refresh block address RFBKADD is maintained to be 'i' (operation S40).

Accordingly, in a flash memory device according to an embodiment, as the 'unit refresh frame' is repeated, the refresh operation is sequentially performed on the memory blocks MBK regardless of normal operations such as a program operation, an erase operation, and a read operation.

Thus, in a flash memory device according to an embodiment of the present invention, the refresh operation may be efficiently performed to fix data disturbance.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A flash memory device comprising:
   a normal memory array including a plurality of normal memory cells arranged in a matrix of word lines and bit lines, wherein the plurality of normal memory cells are divided into a plurality of memory blocks and are programmable and erasable;
   a refresh address generation unit configured to generate a refresh block address, wherein the refresh block address is sequentially increased in response to activation of an refresh driving signal; and a refresh driving unit that is driven to refresh a memory block specified by the refresh block address among the memory blocks of the normal memory array in a unit refresh frame, and generate the refresh driving signal, wherein the refresh driving signal is activated in the unit refresh frame, and deactivated when the memory block specified by the refresh block address is determined as refresh failure.

2. The flash memory device of claim 1, wherein refresh block address is retained when power is not supplied as well as when power is supplied.

3. The flash memory device of claim 1, wherein the refresh address generation unit comprises:
a refresh address storing memory including a plurality of refresh memory cells which are configured to store refresh block data;
a refresh address controller that is driven to increase the refresh block data in response to activation of the refresh driving signal; and
a refresh address generator configured to generate the refresh block address corresponding to the refresh block data.

4. The flash memory device of claim 3, wherein the plurality of normal memory cells of the normal memory array and the plurality of refresh memory cells of the refresh address storing memory are non-volatile memory cells.

5. The flash memory device of claim 3, wherein the plurality of refresh memory cells are capable of retaining the stored refresh block data when power is not supplied as well as when power is supplied.

6. The flash memory device of claim 1, wherein the refresh driving unit comprises:
a row selection unit that is driven to activate word lines of the memory block specified by the refresh block address in the unit refresh frame;
a column selection sensing unit that is driven to specify a bit line according to a column address, sense data of the specified bit line, and output the sensed data as sensing data;
a curing cell determination unit configured to generate a disturbance determination signal, and to be activated when the memory block specified by the refresh block address is determined as refresh failure; and
a controller configured to generate the refresh driving signal, wherein the refresh driving signal is activated when the unit refresh frame occurs and deactivated when the disturbance determination signal is activated.

7. The flash memory device of claim 6, wherein the row selection unit comprises:
a block address selector configured to generate a selected block address which is either the refresh block address or a normal block address selected based on whether a refresh command occurs, wherein the normal block address specifies a memory block of the normal memory array in a normal operation mode; and
a row decoder that is driven to specify the word lines of the normal memory array by decoding the selected block address and a low row address.

8. The flash memory device of claim 6, wherein the column selection sensing unit comprises:
a column decoder configured to activate a specific column selection signal by decoding the column address; and
a column selection sense amplifier configured to sense data of a bit line selected according to the specific column selection signal activated by the column decoder, and provide the sensed data as the sensing data.

9. The flash memory device of claim 6, wherein the curing cell determination unit comprises:
a data checking unit configured to check a data value of the sensing data based on a first reference voltage or a second reference voltage;
a first register configured to store the data value of the sensing data checked based on the first reference voltage as first checking read data;
a second register configured to store the data value of the sensing data checked based on the second reference voltage as second checking read data; and
a data comparator configured to compare the first checking read data and the second checking read data to generate the disturbance determination signal, wherein the disturbance determination signal is activated when first checking read data and second checking read data of a normal memory cell of a memory block designated in the unit refresh frame are different.

10. The flash memory device of claim 9, wherein the memory block is determined as refresh failure when the first checking read data and the second checking read data of at least one among the normal memory cells are different.

11. The flash memory device of claim 9, wherein the data checking unit is configured to check the data value of the sending data based on the first reference voltage in response to activation of a first checking driving signal provided from the controller.

12. The flash memory device of claim 9, wherein the data checking unit is configured to check the data value of the sending data based on the second reference voltage in response to activation of a second checking driving signal provided from the controller.

13. The flash memory device of claim 9, wherein the second reference voltage is higher than the first reference voltage.

* * * * *